United States Patent

Ohtani

[11] Patent Number: 6,063,654
[45] Date of Patent: May 16, 2000

[54] METHOD OF MANUFACTURING A THIN FILM TRANSISTOR INVOLVING LASER TREATMENT

[75] Inventor: Hisashi Ohtani, Kanagawa, Japan

[73] Assignee: Semiconductor Energy Laboratory Co., Ltd., Kanagawa, Japan

[21] Appl. No.: 08/783,745

[22] Filed: Jan. 16, 1997

[30] Foreign Application Priority Data

Feb. 20, 1996 [JP] Japan .................................. 8-058334

[51] Int. Cl.⁷ ........................... H01L 21/00; H01L 21/84
[52] U.S. Cl. ................... 438/166; 438/142; 438/149; 438/151
[58] Field of Search ................... 438/142, 149, 438/151, 166

[56] References Cited

U.S. PATENT DOCUMENTS

| | | |
|---|---|---|
| 4,735,824 | 4/1988 | Yamabe et al. . |
| 5,403,772 | 4/1995 | Zhang et al. . |
| 5,426,064 | 6/1995 | Zhang et al. . |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,529,937 | 6/1996 | Zhang et al. . |
| 5,534,716 | 7/1996 | Takemura . |
| 5,543,352 | 8/1996 | Ohtani et al. . |
| 5,550,070 | 8/1996 | Funai et al. . |
| 5,563,426 | 10/1996 | Zhang et al. . |
| 5,569,610 | 10/1996 | Zhang et al. . |
| 5,569,936 | 10/1996 | Zhang et al. . |
| 5,580,792 | 12/1996 | Zhang et al. . |
| 5,585,291 | 12/1996 | Ohtani et al. . |

(List continued on next page.)

FOREIGN PATENT DOCUMENTS

62-169356  7/1987  Japan .
64-81324   3/1989  Japan .

OTHER PUBLICATIONS

F. G. Kuper, J. Th. De Hosson and J. F. Verwey, "Effects of Fluorine Implantation on the kinetics of dry oxidation of silicon" J. Appl. Phys. 60 (3), p. 985, Aug. 1, 1986.

S. M. Sze, VLSI Technology, second edition, 1988, chapter 3, Oxidation.

R.J. Nemanich et al, "Structure and Growth of the Interface of Pd on α–SiH", The American Physical Society—Physical Review, vol. 22, No. 12, pp. 6828–6831, Jun. 1981.

M.J. Thompson et al, "Silicide Formation in Pd–α–Si:H Schottky Barriers", Appl. Phys. Lett., vol. 39, No. 3, pp. 274–276, Aug. 1981.

R.J. Nemanich et al., "Initial Phase Formation of the Interface of Ni, Pd, or Pt and Si", Mat. Res. Soc. Symp. Proc., vol. 25, 1984.

*Primary Examiner*—Charles Bowers
*Assistant Examiner*—Evan Pert
*Attorney, Agent, or Firm*—Nixon Peabody LLP; Jeffrey L. Costellia

[57] ABSTRACT

Defects at the grain boundaries of a crystal silicon film, which has been crystallized from an amorphous silicon film, are passivated without using a hydrogen plasma treatment. An underlying film and a crystal silicon film which has been crystallized from an amorphous silicon film are formed on a glass substrate. A thermal oxide film is grown on the surface of the crystal silicon film by heating in an oxygen atmosphere into which $NF_3$ gas has been added. As the thermal oxide film is grown, non-coupled Si is generated. The defects at the grain boundaries of the crystal silicon film are passivated by the additional Si. Then, the thermal oxide film is removed and the crystal silicon film is patterned into an island shape to form an active layer of a TFT. A gate insulating film, a gate electrode and the like are then formed sequentially to complete the TFT.

26 Claims, 6 Drawing Sheets

U.S. PATENT DOCUMENTS

| | | |
|---|---|---|
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. . |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 6/1995 | Kusumoto et al. . |
| 5,663,077 | 9/1997 | Adachi et al. . |
| 5,677,549 | 10/1997 | Takayama et al. . |
| 5,684,317 | 11/1997 | Hwang . |
| 5,696,386 | 12/1997 | Yamazaki . |
| 5,696,388 | 12/1997 | Funada et al. . |
| 5,700,333 | 12/1997 | Yamazaki et al. . |
| 5,705,829 | 1/1998 | Miyanaga et al. . |
| 5,712,191 | 1/1998 | Nakajima et al. . |
| 5,744,822 | 4/1998 | Takayama et al. ........................ 257/66 |
| 5,744,824 | 4/1998 | Kousai et al. ............................ 257/74 |
| 5,756,364 | 5/1998 | Tanaka et al. . |
| 5,766,977 | 6/1998 | Yamazaki ................. 438/151 |
| 5,773,327 | 6/1998 | Yamazaki et al. ...................... 438/154 |
| 5,773,846 | 6/1998 | Zhang et al. .............................. 257/66 |
| 5,773,847 | 6/1998 | Hayakawa ................. 257/66 |
| 5,795,795 | 6/1998 | Kousai et al. . |
| 5,808,321 | 9/1998 | Mitanaga et al. ......................... 257/72 |
| 5,811,327 | 9/1998 | Funai et al. ............................ 436/166 |
| 5,818,076 | 10/1998 | Zhang et al. . |
| 5,821,138 | 10/1998 | Yamazaki et al. ...................... 438/166 |
| 5,824,574 | 10/1998 | Yamazaki et al. ...................... 438/150 |

FIG. 1A
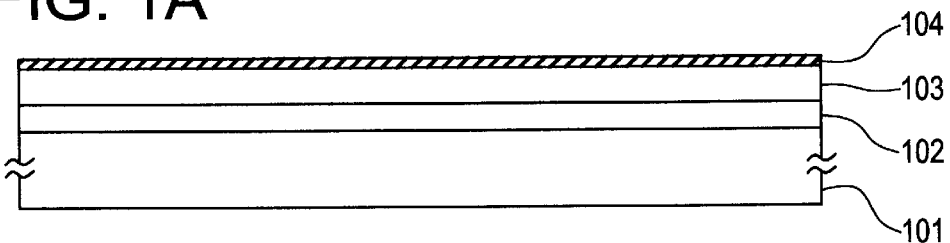
FIG. 1B   CRYSTALLIZATION STEP
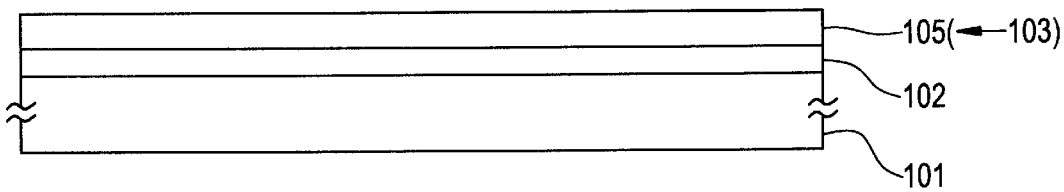
FIG. 1C   THERMAL OXIDATION STEP
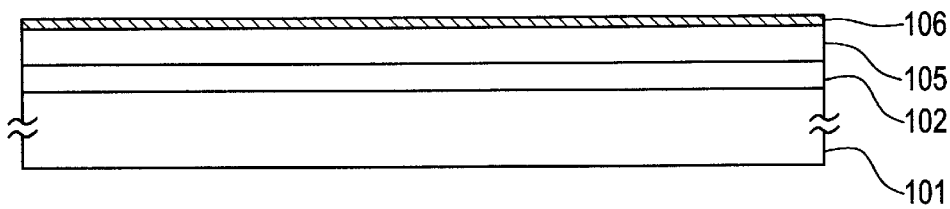
FIG. 1D
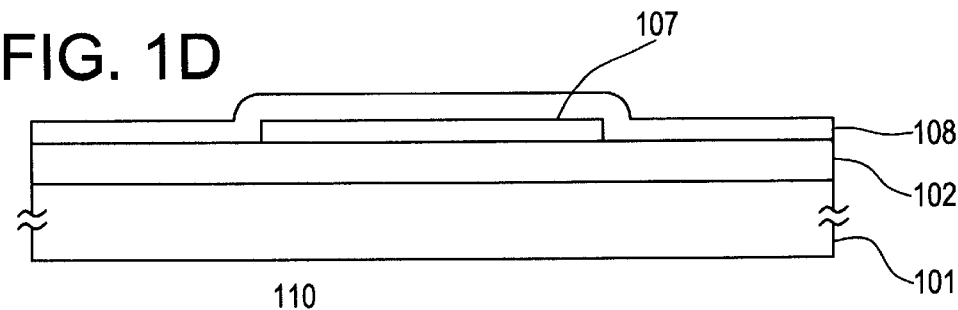
FIG. 1E
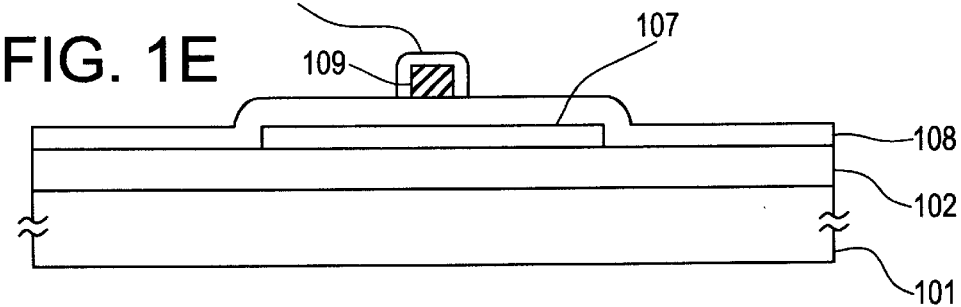

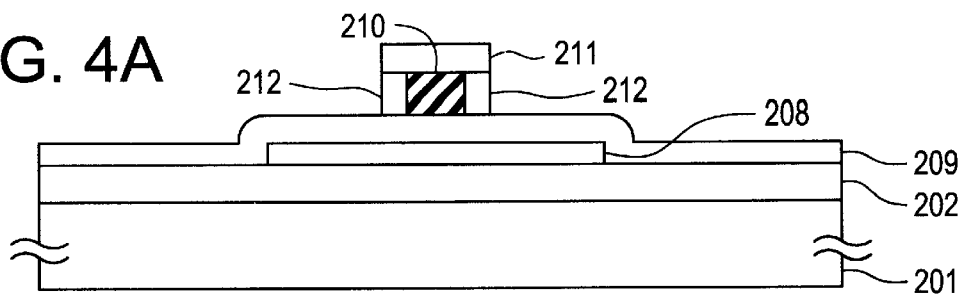
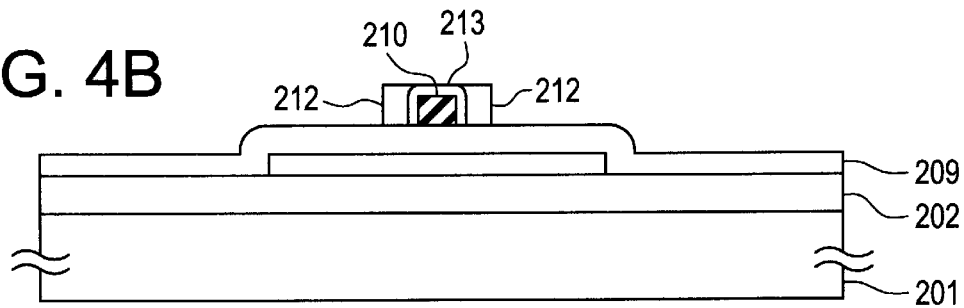
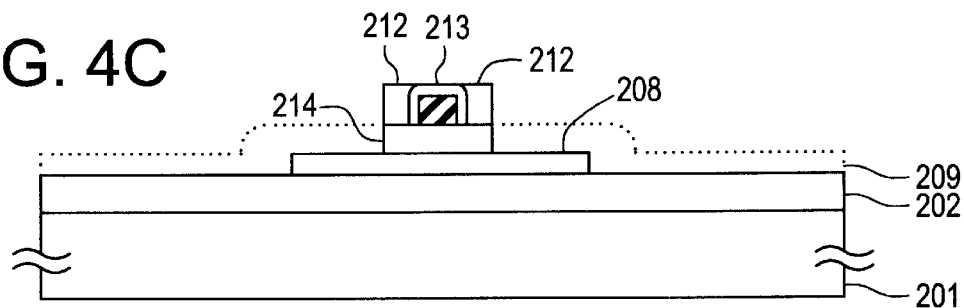
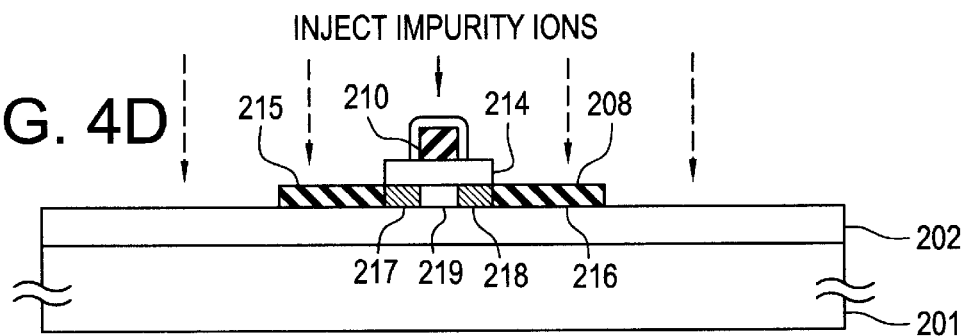
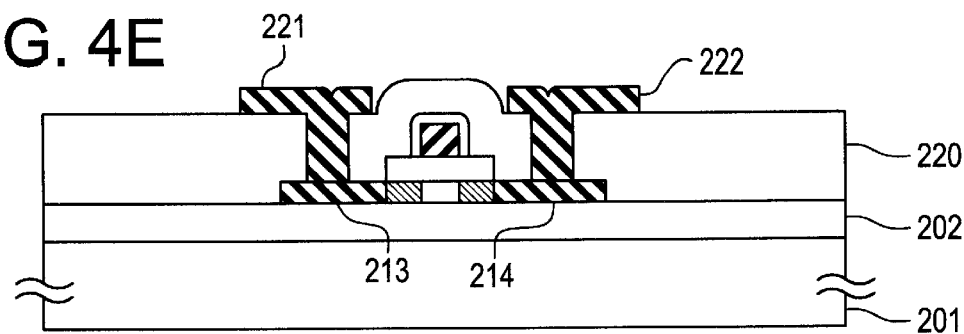

THERMAL OXIDATION STEP

PHOSPHORUS IONS

PHOSPHORUS IONS

METHOD OF MANUFACTURING A THIN FILM TRANSISTOR INVOLVING LASER TREATMENT

BACKGROUND OF THE INVENTION

1. Field of the Invention

The present invention relates to a method for fabricating an insulated gate type semiconductor device such as a thin film transistor.

2. Description of Related Art

Because an active matrix liquid crystal display is small, light and able to display high resolution motion pictures at high speed, it is expected to become one of the most used displays of the future. However, because the substrate of a liquid crystal display needs to be translucent, the type of substrate to be used with the display is limited. A glass substrate, a quartz substrate or a plastic substrate may be cited as examples thereof However, a plastic substrate has a problem in that it lacks heat resistance and a quartz substrate has a problem in that it is very expensive. Its cost is more than 10 times that of a glass substrate especially when it is widened, although it can withstand a high temperature of around 1000° C. Accordingly, the glass substrate is widely used in general for the reasons of heat resistance and economy.

Currently, the performance required of liquid crystal displays is increasing and the performance and characteristics required of a thin film transistor (hereinafter referred to as a TFT) used as a switching element in such displays is also increasing. Due to this, research for forming a crystal silicon film on a glass substrate is being actively conducted. The crystal silicon film is formed on the glass substrate by forming an amorphous silicon film and crystallizing it by heat treatment at the present.

Because the heat resistance temperature of the glass substrate is normally about 600° C., a process which exceeds this temperature cannot be used for forming the crystal silicon film. Therefore, a method of forming amorphous silicon film by means of plasma CVD or reduced pressure CVD and of crystallizing it by heat has been adopted in forming a crystal silicon film on a glass substrate.

A technology of crystallizing the silicon film by irradiating laser light is also known and allows a crystal silicon film having an excellent crystallinity to be formed on the glass substrate has an advantage that the laser light will not damage the glass substrate thermally.

However, the crystal silicon film crystallized from the amorphous silicon film has had a large number of defects caused by dangling bonds and the like. Because these defects are a factor causing degradation of the characteristics of the TFT, it is necessary to passivate the defects at the interface between the active layer and the gate insulating film and the defects within and at the boundaries of the crystal grains of the silicon of the active layer when fabricating a TFT utilizing such crystal silicon films. The defects at the grain boundaries in particular are the main factor causing scattering of charge. However, it is very difficult to passivate the defects at the grain boundary.

It is possible to compensate the defects at the grain boundaries of a crystal silicon film by Si when fabricating a TFT on a quartz substrate because it is possible to implement a heat treatment at a high temperature of around 1000° C. In contrast to this, it is difficult to implement a heat treatment at high temperatures when fabricating the TFT on a glass substrate. Thus, the defects at the grain boundaries of the crystal silicon film are passivated by hydrogen by implementing a hydrogen plasma treatment in an atmosphere of about 300 to 400° C. normally in the final stage of the process. An n-channel type TFT has a practical field-effect mobility when the hydrogen plasma treatment is implemented.

On the other hand, the effect of the hydrogen plasma treatment is not so remarkable for a p-channel type TFT. This is assumed to happen because a level caused by the defect of the crystal is formed in a relatively shallow domain under a conduction electron zone.

Although it is possible to compensate the defect of the grain boundaries of the crystal silicon film by implementing the hydrogen plasma treatment, the reliability of the TFT or the n-channel type TFT, in particular, which has been treated by the hydrogen plasma, is not stable because the hydrogen compensating the defect is apt to be desorbed. For instance, if the n-channel type TFT is energized for 48 hours in an atmosphere of 90° C., its mobility is reduced to a half.

Further, although the quality of the crystal silicon film obtained by irradiating laser light is good, ridges (irregularity) are formed on the surface of the crystal silicon film if the thickness of the film is less than 1000 angstrom. When laser light is irradiated to the silicon film, the silicon film melts instantly and expands locally. The ridges are formed on the surface of the crystal silicon film to relax internal stress caused by this expansion. The difference of elevation of this ridge is about ½ to 1 times the thickness of the film. For instance, when laser annealing is implemented after crystallizing an amorphous silicon film whose thickness is about 700 Å by way of heating, ridges of 100 to 300 Å in height are formed on the surface thereof.

Because a potential barrier and a trap level caused by the dangling bonds, distortion of the lattice and the like are formed at the ridges on the surface of the crystal silicon film in an insulated gate type semiconductor device. Hence, the level of the interface between the active layer and the gate insulating film becomes high. Further, because the peak of the ridges is sharp and thus an electric field is apt to concentrate there, it may become a source of leakage current, eventually causing dielectric breakdown. Further, because the ridges on the surface of the crystal silicon film lessen the coating quality of the gate insulating film deposited by way of sputtering or CVD, the reliability of the insulation is degraded thus resulting in defective insulation.

BRIEF SUMMARY OF THE INVENTION

It is an object of the present invention to solve the aforementioned problems by providing a method for fabricating a semiconductor device which allows the defects at the crystal boundary of silicon film crystallized from amorphous silicon film to be passivated without using the hydrogen plasma treatment.

It is another object of the present invention to provide a method for fabricating a semiconductor device having a high reliability and high mobility and more particularly to provide a method for fabricating and enhancing the reliability and characteristics of a semiconductor device having a gate insulating film made of deposited films and formed on a glass substrate.

In order to solve the aforementioned problems, an inventive method for fabricating a semiconductor device comprises steps of forming an amorphous silicon film; crystallizing the amorphous silicon film to form a crystal silicon film; forming a thermal oxide film on the surface of the crystal silicon film by heating in an oxidizing atmosphere to which fluorine compound gas is added; removing the thermal oxide film on the surface of the crystal silicon film; and depositing an insulating film on the surface of the crystal silicon film.

Further, another inventive method for fabricating a semiconductor device by fabricating a thin film transistor on a substrate having an insulated surface comprises steps of forming an amorphous silicon film; crystallizing the amorphous silicon film to form a crystal silicon film; forming a thermal oxide film on the surface of the crystal silicon film by heating in an oxidizing atmosphere to which fluorine compound gas is added; removing the thermal oxide film on the surface of the crystal silicon film; forming an active layer of the thin film transistor by shaping the crystal silicon film; depositing an insulating film on the surface of the active layer to form a gate insulating film at least on the surface of a channel domain; forming a gate electrode on the surface of the gate insulating film; and forming a source and a drain in a self-aligning manner by injecting impurity ions which give a conductive type to the active layer by using the gate electrode as a mask.

Modes for carrying out the present invention will be explained with reference to FIGS. 1 and 2. FIGS. 1 and 2 are diagrams for explaining the fabrication steps of a thin film transistor (TFT), wherein an underlying film 102 and an amorphous silicon film 103 are laminated sequentially on a glass substrate 101 and nickel (Ni) layer 104 is formed on the surface of the amorphous silicon film 103 as shown in FIG. 1A.

When a heat treatment is implemented in this state, the amorphous silicon film 103 is crystallized and a crystal silicon film 105 is formed as shown in FIG. 1B. Although the step for forming the nickel layer 104 is not essential, nickel allows the heating temperature in the crystallization step to be lowered and the heating time to be shortened because it functions as a catalyst for lowering thermal energy required for the crystallization. While Fe, Co, Ru, Rh, Pd, Os, Ir, Pt, Cu and Au may be used as such a catalytic element, beside nickel (Ni), the catalytic effect of nickel is most remarkable.

It is noted that the crystal silicon film may be formed by using known technologies or the like without using the nickel element. Further, laser light may be irradiated as the crystallization step instead of the heat treatment. Further, it is possible to implement light annealing by means of laser light or infrared rays or thermal annealing after forming the crystal silicon film.

FIG. 1C shows a thermal oxidation step. As the thermal oxide film 106 is formed on the surface of the crystal silicon film 105, i.e. with the formation of Si—O coupling, non-coupled Si is also generated. This excessive Si diffuses within the crystal silicon film 105 from the interface between the thermal oxide film 106 and the crystal silicon film 105 and couples with dangling bond of Si existing in the grain boundary, thus passivating the defects at the grain boundary of the crystal silicon film 105. Thereby, the mobility of the TFT composed of the crystal silicon film 105 may be improved. Further, Si which passivates the defects eliminates the hydrogen plasma treatment because it will not readily desorb from the crystal silicon film 105 like hydrogen in the following fabrication process steps involving heating.

For example, concerning to an N-channel TFT fabricated in accordance with the inventive method for fabricating a semiconductor device, the mobility after the hydrogen plasma treatment increases only 10 to 20% as compared to that before the hydrogen plasma treatment. This indicates that the defects of the crystal silicon film 105 has been fully passivated in the thermal oxidation step and that Si which passivates the defects is not desorbed during the fabrication step.

Taking into consideration that the object of the thermal oxidation step in the present invention is to supply Si for passivating the defects of the grain boundary of the crystal silicon film and that the crystal silicon film 105 composes the active layer of the TFT, the thermal oxide film 106 may be formed in a thickness of about 200 to 500 angstrom without considering film quality characteristics such as pressure resistance. Further, since it is intended to fabricate the TFT on a glass substrate in the present invention, the thermal oxidation step has to be so implemented that distortion or deformation of the substrate caused by heat is tolerable. For example, the upper limit of the heating temperature may be set by the criterion of the distortion point of the glass substrate.

In the present invention, the thermal oxidation step is implemented in an oxidizing atmosphere in which fluorine compound is added. In particular, the thermal oxidation is implemented within an atmosphere in which $NF_3$ gas or the like is added to oxygen gas. The thermal oxide film may be grown to several hundred angstroms by heating for several to 10-odd hours at temperatures below the distortion point of the glass substrate by adequately controlling the concentration of $NF_3$ gas.

Although it has been known that the growth of the thermal oxide film may be accelerated by adding gas which supplies Cl radicals such as HCl to the oxidizing atmosphere, beside the gas which supplies fluorine radicals such as $NF_3$ gas, it is not suitable because it takes time to form the thermal oxide film in a thickness of several hundreds angstrom by heating in temperatures below the distortion point of the glass substrate, e.g. in the temperature around 600 to 500° C. The thermal oxide film may be formed in a thickness around 200 angstrom by heating for four hours at 600° C. within the oxidizing atmosphere in which 450 ppm of $NF_3$ gas is added to oxygen gas.

Further, because the supplied fluorine radicals concentrate at a convex portion on the surface of the crystal silicon film 105 in the thermal oxidation step, thermal oxidation of the convex portion proceeds most and that of a concave portion is suppressed. Further, because the thermal oxide film 106 contains fluorine in high concentration and stress is relaxed, the thermal oxide film 106 is formed in a uniform thickness on the surface of the crystal silicon film 105 such that the convex portion is rounded.

Because the heating temperature and heating time need to be determined in the thermal oxidation step such that the distortion and deformation of the substrate fall within the permissible range, the concentration of fluorine compound within the thermal oxidation atmosphere may increase. As a result, the thermal oxide film 108 may contain a large amount of fluorine, thus forming Si—F bonds as a result. However, because the thermal oxide film 106 is formed as a film grown to supply Si which passivates the defects at the grain boundary of the crystal silicon film and as a film to be removed later, it is not required to have the high function and high reliability like the gate insulating film and the instability of Si—F bond and the like existing within the thermal oxide film 106 or its pressure resistance does not matter.

FIG. 1D shows the active layer 107 and the gate insulating film 108 formed by patterning the crystal silicon film 105 after eliminating the thermal oxide film 106.

According to the present invention, the gate insulating film 108 is formed by such deposition methods as plasma CVD and sputtering. Although it is possible to employ thermal oxidation to form the gate insulating film 108, the film quality of the thermal oxide film obtained by the thermal oxidation at a low temperature which avoids deformation of the glass substrate is not good. Due to this, in the present invention, the gate insulating film is formed by deposition such as by plasma CVD or sputtering in order to stably obtain a gate insulating film having the predetermined characteristics.

Because the surface of the active layer 107 (the crystal silicon film 105) is flattened by going through the thermal oxidation step in the present invention, the gate insulating film may be formed with a good coating capability even if it is formed by such deposition methods. Thereby, the interfacial level between the gate insulating film and the active layer may be lowered.

While the crystal silicon film obtained by irradiating laser light has an excellent crystallinity, a ridge having a sharp projection is formed on the surface thereof as described in description of the related art. For instance, when laser annealing is implemented after heating an amorphous silicon film of about 700 angstrom to crystallize it, a ridge having about 100 to 300 angstroms of height is formed on the surface thereof. The height difference on the surface of the crystal silicon film may be reduced to about several tens angstrom by forming a thermal oxide film of about 500 angstrom thickness by implementing thermal oxidation for 12 hours within an atmosphere in which about 450 ppm of $NF_3$ gas is added to oxygen gas. Accordingly, the insulating film may also be favorably deposited by CVD on the surface of a crystal silicon film crystallized by laser light.

FIG. 2A shows a step for doping impurity ions. A gate electrode 109 functions as a mask and a source domain 111, a drain domain 112 and a channel domain 113 are formed in a self-aligning manner. Further, an interlayer insulating film 114, electrodes 115 and 116 are formed as shown in FIG. 2B, thus completing the TFT.

BRIEF DESCRIPTION OF THE DRAWINGS

FIGS. 1A through 1E show steps for fabricating a TFT according to a first embodiment;

FIGS. 4A through 4E show steps for fabricating a TFT according to the second embodiment.

BRIEF DESCRIPTION OF THE PREFERRED EMBODIMENTS

[First Embodiment]

Figure 2A:
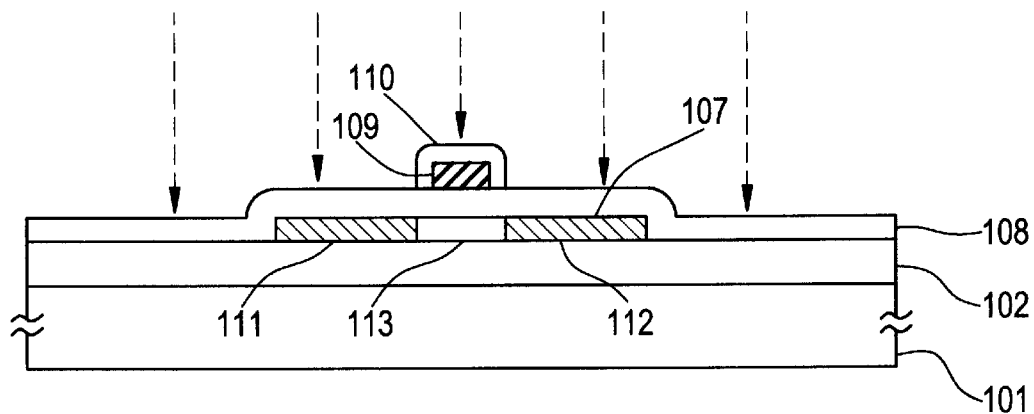
FIGS. 2A through 2B show steps for fabricating the TFT according to the first embodiment.
Figure 2B:
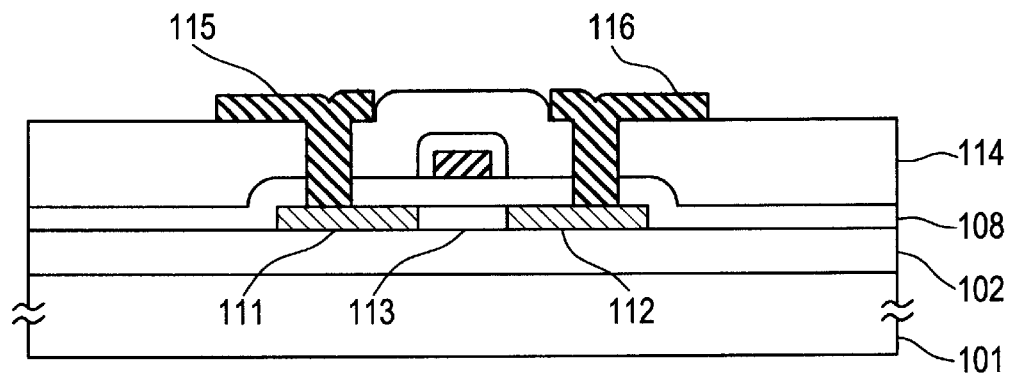

FIGS. 1A–1E and 2A–2B are diagrams for explaining steps for fabricating a TFT according the present embodiment, i.e. section views showing each step. According to the present embodiment, a TFT is fabricated by using a silicon film crystallized by utilizing a catalytic action of a metal element which promotes crystallization of silicon. Nickel is adopted as the metal element in the present embodiment.

As shown in FIG. 1A, a silicon oxide film is formed as an underlying film 102 on a glass substrate 101 (Corning 1737, distortion point: 667° C.) by means of plasma CVD or reduced pressure CVD. Next, a substantially intrinsic (I type) amorphous silicon film 103 is formed by means of plasma CVD or reduced pressure CVD in a thickness of 700 to 1000 angstrom. The thickness of the amorphous silicon film 103 is preferably 700 angstroms.

UV rays are irradiated to the surface of the amorphous silicon film 103 within an oxidizing atmosphere to form an oxide film (not shown) in a thickness of several twenties of angstroms. After that, solution containing a nickel element is applied on the surface of the oxide film. The oxide film improves wetting of the surface of the amorphous silicon film 103 to suppress the solution from being repelled. In the present embodiment, nickel acetate aqueous solution containing 1 to 100 ppm of nickel is used as the solution containing nickel element. The nickel acetate solution is applied by a spinner or the like and is then dried to form a nickel layer 104. Although the nickel layer 104 may not be formed as a complete film, the nickel element is held in contact on the surface of the amorphous silicon film 103 via the oxide film not shown in this state.

However, it is difficult to obtain the effect of promoting the crystallization if the nickel concentration within the silicon film is less than $1 \times 10^{16}$ atoms/cm$^3$. When the nickel concentration is above $5 \times 10^{19}$ atoms/cm$^3$, the characteristics as a semiconductor of the silicon film thus obtained is lost and the characteristic as a metal appears. Therefore, conditions of the process such as the concentration of nickel within the nickel acetate solution, the number of times of application and the applied amount are set in advance so that the average nickel concentration within the amorphous silicon film finally obtained falls in the range of $1 \times 10^{16}$ atoms/cm$^3$ to $5 \times 10^{19}$ atoms/cm$^3$. It is noted that the concentration of nickel may be measured by SIMS (secondary ion mass spectrometry).

In the state in which the nickel element is held on the surface of the amorphous silicon film 103, a heat treatment is implemented within a nitrogen atmosphere to crystallize the amorphous silicon film 103 and to form a crystal silicon film 105 as shown in FIG. 1B. While it is necessary to heat at a temperature more than 450° C. in order to crystallize silicon, it is desirable to heat at a temperature more than 550° C. because it takes several tens hours to crystallize the amorphous silicon film in the temperature range of 450 to 500° C. It is noted that the heating temperature must be within the range in which the deformation or contraction of the glass substrate caused by heating is permissible in all the steps, not only the crystallization step shown in FIG. 1B. The reference of the upper limit of the heating temperature may be set at the distortion point of the substrate for example. Because the glass substrate 101 whose distortion point is 667° C. is used in the present embodiment, the heat treatment is implemented at 620° C. for four hours.

Due to the heating, nickel heads from the surface of the amorphous silicon film 103 to the interface with the underlying film 102 and diffuses in a direction almost vertical to the glass substrate 101. Along that, crystal growth of silicon proceeds, thus forming the crystal silicon film 105. This crystal growth advances unorderly in a direction vertical to the glass substrate 101. Such growth process will be referred to as a vertical growth here. It is noted that the crystallinity of the crystal silicon film 105 may be improved further by implementing light annealing by means of laser light or infrared rays or heat annealing as necessary after the crystallization step. The light annealing and the heat annealing may be also used in combination.

However, when the laser annealing is implemented, preferably the thickness of the amorphous silicon film 103, i.e. the starting film of the crystal silicon film 105, is set below 1000 angstrom, or 700 to 800 angstrom, in order to effectively supply thermal energy to the crystal silicon film 105 by the laser light.

Next, a thermal oxide film 106 is formed in a thickness of 200 to 500 angstrom on the surface of the crystal silicon film 105 by heating in an oxidizing atmosphere containing fluorine atoms. In the present embodiment, the thermal oxide film 106 is formed in a thickness of about 200 angstrom by heating for four hours at 600° C. within the atmosphere in which 400 ppm of $NF_3$ is added to oxygen gas. As a result, the thickness of the crystal silicon film 105 which has been about 700 angstrom before the formation of the thermal oxide film 106 is reduced to about 600 angstrom. Because the crystal silicon film 105 eventually comprises an active layer of the TFT, the thickness of the amorphous silicon film 103 has to be determined taking the thickness of the oxide film 106 into consideration so as to be able to obtain the active layer having a necessary thickness.

As the thermal oxide film 106 is formed on the surface of the crystal silicon film 105, non-coupled Si is also generated. This excessive Si diffuses within the crystal silicon film 105 from the interface between the thermal oxide film 106 and the crystal silicon film 105 and couples with dangling bonds of Si existing in the grain boundary, thus reducing the density of defects at the grain boundary of the crystal silicon film 105. Further, because Si which passivates the defects will not readily desorb from the crystal silicon film 105 like hydrogen in the following fabrication process involving heating, the crystal silicon film 105 is suitable as a material of a semiconductor device such as a TFT.

Further, because the oxidation rate is different at convex and concave portions on the surface of the crystal silicon film 105, the convex portion is rounded and is flattened. It is noted that because the ridges are formed on the surface of the crystal silicon film 105 when it is irradiated by laser light, the conditions of the thermal oxidation process such as the thickness of the thermal oxide film 106 and the concentration of $NF_3$ gas are set taking the thickness of the crystal silicon film 105 after the thermal oxidation process into consideration so that the ridges can be flattened or removed as much as possible.

Next, the thermal oxide film 106 is eliminated by etching as shown in FIG. 1D. At this time, etching solution or etching gas having a high etching rate for silicon oxide and silicon is used. The thermal oxide film 106 is eliminated by means of wet etching using hydrofluoric etchant such as buffer hydrofluoric acid in the present embodiment.

Next, the crystal silicon film 105 is patterned into an island shape to form the active layer 107 of the TFT. Then, a silicon oxide film is formed as a gate insulating film 108 in a thickness of 1000 angstrom by means of plasma CVD. Because the surface of the active layer 107 has been flattened in the thermal oxidation step, the gate insulating film 108 may be deposited with a favorable coating quality.

Next, an aluminum film containing a trace amount of scandium not shown is formed in a thickness of 6000 angstrom on the surface of the gate insulating film 108 by means of electron beam deposition and is patterned as shown in FIG. 1E to form a gate electrode 109. Then, an oxide layer 110 is formed by implementing anodization within an electrolyte by setting the gate electrode 109 at the anode. In this case, the anodic oxide layer 110 having a dense structure is formed in a thickness of 2000 angstrom within an ethylene glycol solution containing 3% of tartaric acid as the electrolyte by setting the gate electrode 109 at the anode and platinum at the cathode and by applying voltage. It is noted that the thickness of the anodic oxide 110 may be controlled by adjusting the application time of the voltage.

Next, as shown in FIG. 2A, impurity ions which give one conductive type to the active layer 107 are injected by means of ion injection or plasma ion injection in order to form a source domain 111 and a drain domain 112. Here, P (phosphorus) ions are injected to the active layer 106 by using phosphine diluted to 1 to 10% by $H_2$ gas in order to fabricate an N-channel type TFT. On the other hand, B (boron) ions are injected when fabricating a P-channel type TFT by using diborane diluted similarly to 1 to 10%.

When the impurity ions are injected to the active layer 107, the gate electrode 109 and the anodic oxide 110 around thereof function as a mask, thus defining the domains into which the impurity ions have been injected as the source domain 111 and the drain domain 112 and defining the domain into which no impurity ions have been injected as a channel 113. It is noted that the doping conditions such as the dosage and the acceleration voltage are controlled so that the concentration of the impurity ions in the source domain 111 and the drain domain 112 turns out to be in the range of $3 \times 10^{19}$ to $1 \times 10^{21}$ atoms/cm$^3$. After the doping, laser light is irradiated to activate the impurity ions injected to the source domain 111 and the drain domain 112.

Next, a silicon oxide film is formed by mean of plasma CVD in a thickness of 7000 angstrom as an interlayer insulating film 114. Then, contact holes are created to form electrodes 115 and 116 which are connected with the source domain 111 and the drain domain 112, respectively, by materials mainly made of aluminum. Finally, a hydrogen plasma treatment is implemented at 300° C., thus completing the thin film transistor shown in FIG. 2B. It is noted that the main purpose of this hydrogen plasma treatment is not to passivate the defects of the active layer 107 but to passivate the interface between the active layer 107 and the electrodes 115 and 116 made of aluminum.

There has been no big change in the field effect mobility of the P-channel type TFT fabricated in accordance to the fabrication process of the present embodiment before and after the implementation of the hydrogen plasma treatment. This is construed that it does not mean that the thermal oxidation step shown in FIG. 1C has no passivation effect, but that it means that the passivation of the defects at the grain boundary of the active layer 107 is not the best means for improving the field effect mobility in the P-channel type TFT, as it is supposed from the fact that the field effect mobility of the P-channel type TFT is not remarkably improved by the passivation only by way of the hydrogen plasma treatment as described above.

On the other hand, for the N-channel type TFT fabricated in accordance to the fabrication process of the present embodiment, while the field effect mobility has been 200 cm$^2 \cdot V^{-1} \cdot s^{-1}$ before the implementation of the hydrogen plasma treatment, the field effect mobility has increased only by about 10 to 20% after the implementation of the hydrogen plasma treatment. This fact indicates that although a N-channel type TFT has not been practical unless it is treated by hydrogen plasma in the past, a practical N-channel type TFT may be fabricated only by implementing the thermal oxidation by adding $NF_3$ like the present embodiment.

That is, it indicates that not so many defects at the grain boundary of the active layer 107 have been passivated by hydrogen in the hydrogen plasma treatment, but many of the defects at the grain boundary are passivated in the thermal oxidation step shown in FIG. 1C. Accordingly, most of the defects passivated by the hydrogen plasma treatment of the present embodiment are those generated after the thermal oxidation step, i.e. mainly those generated in forming the electrodes 115 and 116.

Further, the defects at the grain boundary of the active layer 107 have been passivated by Si in the present embodiment. Because Si does not desorb readily from the active layer due to the thermal influence like H, it becomes possible to form the TFT having excellent heat resistance and the high reliability.

[Second Embodiment]

FIGS. 3 and 4 are diagrams for explaining steps for fabricating a TFT according to the present embodiment, i.e. section views showing each step. In the present embodiment, a TFT is fabricated using a silicon film crystallized by utilizing a catalytic action of a metal element which promotes crystallization of silicon. Nickel is used as the metal element in the present embodiment.

Figure 3A:
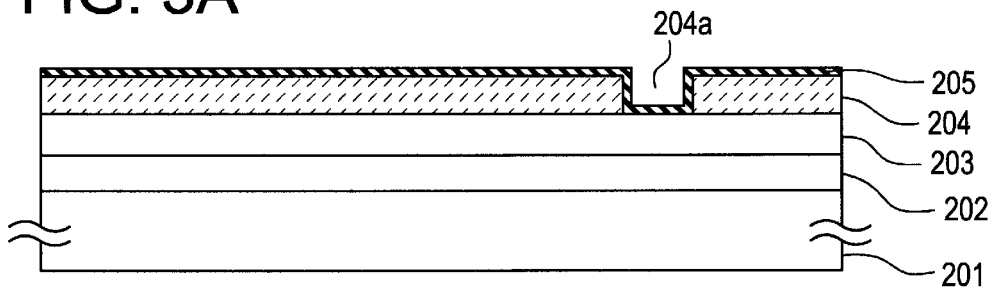
FIGS. 3A through 3E show steps for fabricating a TFT according to a second embodiment.
Figure 3B:
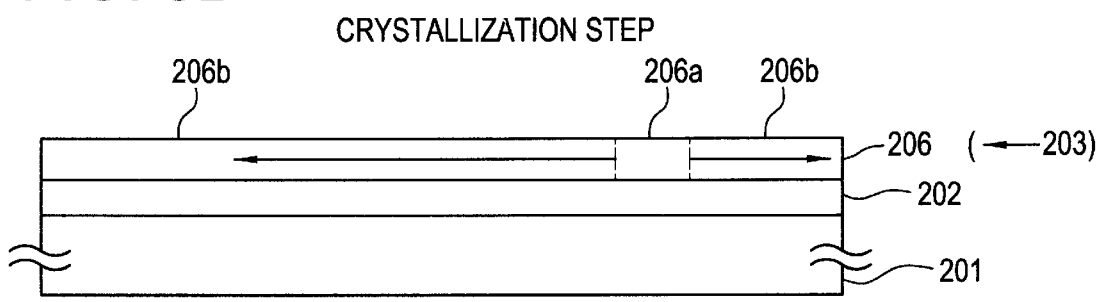

As shown in FIG. 3A, a silicon oxide film is formed as an underlying film 202 on a glass substrate 201 (Corning 1737, distortion point: 667° .C) in a thickness of 3000 angstrom by means of plasma CVD or reduced pressure CVD. Next, a substantially intrinsic amorphous silicon film 203 is formed by means of plasma CVD or reduced pressure CVD in a thickness of 700 to 1000 angstrom. Here, the thickness of the amorphous silicon film 203 is set at 1000 angstrom.

UV rays are then irradiated to the surface of the amorphous silicon film 203 within an oxidizing atmosphere to form an oxide film not shown in a thickness of several twenties angstrom. A solution containing a nickel element is applied on the surface of the oxide film. The oxide film is formed to improve wetting of the surface of the amorphous silicon film 203 to suppress the solution from being repelled.

Then, a mask film 204 having an opening 204a and formed of a silicon oxide film of 1500 angstrom thick is formed. The opening 204a has a slit-like shape having the longitudinal direction in the direction vertical to the drawing. Preferably, the opening 204a has a width of 20 $\mu$m or more and the size in the longitudinal direction thereof is determined adequately corresponding to the size of the substrate and the like.

Next, nickel acetate solution containing 1 to 100 ppm of nickel element is applied by a spinner and is then dried to form a nickel layer 205. Although the nickel layer 205 may not be formed as a complete film, nickel element is held in contact on the surface of the amorphous silicon film 203 via the oxide film not shown at the opening 204a of the mask film 204 in this state.

Then, a heat treatment is implemented four hours at 620° C. to crystallize the amorphous silicon film 203 and to form a crystal silicon film 206. Because the crystal grows vertically in the amorphous silicon film 203 from the surface of a domain 206a exposed at the opening 204a of the mask film 204 to the underlying film 202, the domain 206 turns out to be a vertical-growth domain. Then, in the domain 206b, the crystal starts to grow in parallel with the surface of the crystal silicon film 206 as indicated by arrows. The crystallization step in which the crystal grows in one direction as such will be referred as lateral growth. Accordingly, the domain 206b of the crystal silicon film 206 is the laterally grown domain.

Figure 3C:
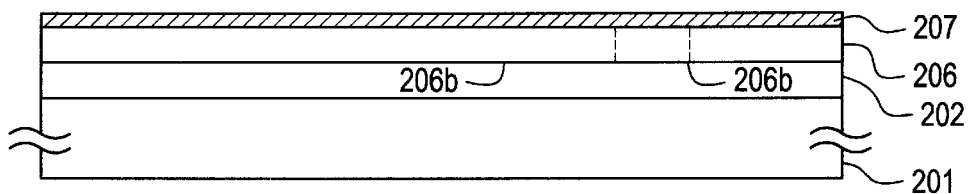

Next, after removing the mask film 204 made of the silicon oxide film as shown in FIG. 3C, a thermal oxide film 207 is formed in a thickness of 200 to 500 angstrom on the surface of the crystal silicon film 206 by heating in an oxygen atmosphere containing fluorine atoms. It is noted that the crystallinity of the crystal silicon film 206 may be improved further by implementing light annealing by means of laser light or infrared rays, or heat annealing, as necessary after the crystallization step. The light annealing and the heat annealing may be used in combination.

The thermal oxide film 207 is formed in a thickness of about 500 angstrom by heating for 12 hours at 600° C. within the atmosphere in which 450 ppm of $NF_3$ is added to oxygen gas to implement the thermal oxidation step. As a result, the thickness of the crystal silicon film 206 which has been about 1000 angstrom is reduced to about 750 angstrom.

As the thermal oxide film 207 is formed on the surface of the crystal silicon film 206, non-coupled Si is also generated. The Si atoms couple with dangling bond of Si at the grain boundary, thus passivating the defects of the crystal silicon film 206. The density of the defects at the grain boundary of the crystal silicon film 206 may be fully reduced by forming the thermal oxide film 207 in a thickness of about 500 angstrom with respect to the crystal silicon film 206 having the thickness of 1000 angstrom.

Figure 3D:
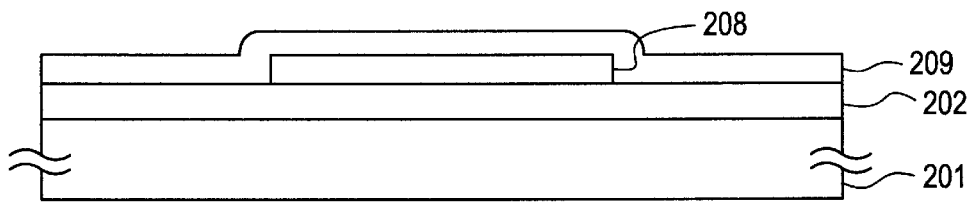

Next, the thermal oxide film 207 is eliminated by etching as shown in FIG. 3D. At this time, etching solution or etching gas having a high etching rate for silicon oxide and silicon is used. In the present embodiment, the thermal oxide film 206 is eliminated by means of wet etching using an etchant of the buffer hydrofluoric acid.

Figure 3E:
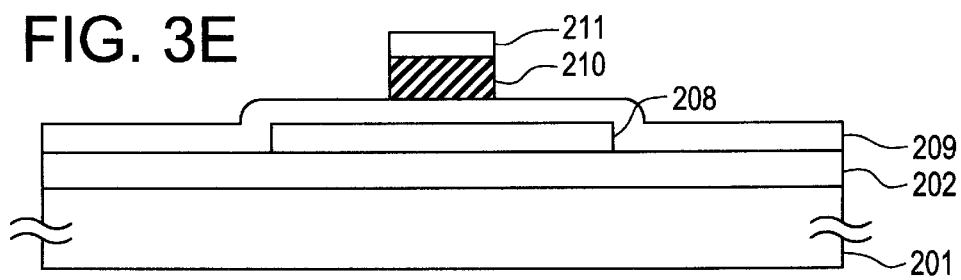

Next, the crystal silicon film 206 is patterned into an island shape to form an active layer 208 of the TFT as shown in FIG. 3E. In this case, preferably, the active layer 208 is made of only the laterally grown domain 206b. Then, a silicon oxide film 209 which composes a gate insulating film is formed on the surface of the active layer 208 by means of plasma CVD or reduced pressure CVD. Further, an aluminum film which composes a gate electrode 210 is formed on the surface of the silicon oxide film 209 in a thickness of 5000 angstrom by sputtering. Providing a small amount of scandium beforehand suppresses hillocks or whiskers from being produced in the later heating step.

Then, the surface of the aluminum film is anodized to form a very thin and dense anodic oxide not shown. Next, a resist mask 211 is formed on the surface of the aluminum film. At this time, because the dense anodic oxide not shown is formed on the surface of the aluminum film, the mask 211 may be formed in close adhesion. Next, the aluminum film is etched by using the resist mask 211 to form a gate electrode 210 as shown in FIG. 3E.

Then, the gate electrode 210 is anodized while leaving the resist mask 211 as shown in FIG. 4A to form a porous anodic oxide 212 in a thickness of 4000 angstrom. At this time, because the resist mask 211 is adhering on the surface of the gate electrode 210, the porous anodic oxide 212 is formed only on the sides of the gate electrode 210.

Next, the gate electrode 210 is anodized again within the electrolyte after peeling off the resist mask 211 to form a dense anodic oxide 213 in a thickness of 1000 angstrom.

The anodic oxides may be formed differently by changing the electrolytes to be used. When the porous anodic oxide 212 is to be formed, acidic solution containing 3 to 20% of citric acid, oxalic acid, chromic acid or sulfuric acid may be used. When the dense anodic oxide 213 is to be formed on the other hand, electrolyte in which ethylene glycol solution containing 3 to 10% of tartaric acid, boric acid or nitric acid is prepared so as to have pH of about 7 may be used.

As shown in FIG. 4C, the silicon oxide film 209 is etched by using the gate electrode 210 and the porous anodic oxide 212 around it and the dense anodic oxide 213 as a mask to form a gate insulating film 214.

Next, as shown in FIG. 4D, impurities which give a conductive type to the active layer 208 are injected by using the gate electrode 210, the dense anodic oxide 213 and the gate insulating film 214 as a mask by means of ion doping after eliminating the porous anodic oxide 212. In the present embodiment, P (phosphorus) ions are doped by using phosphine as the doping gas to fabricate an n-channel TFT. It is noted that the conditions such as the dosage and the acceleration voltage are controlled so that the gate insulating film 212 functions as a semi-permeable mask during the doping.

As a result of the doping, phosphorus ions are injected in high concentration to the domain not covered by the gate insulating film 212, thus forming a source domain 215 and a drain domain 216. Further, P ions are injected in low concentration to the domain covered only by the gate insulating film 214, thus forming low concentrate impurity domains 217 and 218. Because no impurity is injected to the domain right below the gate electrode 210, a channel 219 is formed. After the doping step, thermal annealing, laser annealing or the like is implemented to activate the doped phosphorus ions.

Because the low concentrate impurity domains 217 and 218 function as high resistant domains, they contribute in the reduction of OFF current. The low concentrate impurity domain 218 on the side of the drain 216 is specifically called an LDD. Further, because an offset structure in which the impurity domain is shifted from the end face of the gate electrode 210 may be realized by making the dense anodic oxide 212 fully thick, the OFF current may be reduced further.

Next, a silicon oxide film is formed by mean of plasma CVD in a thickness of 5000 angstrom as indicated as an interlayer insulator 220 as shown in FIG. 4E. It is noted that beside the mono-layer film of the silicon oxide film, a mono-layer film of a silicon nitride film or a laminated film of the silicon oxide film and the silicon nitride film may be formed as the interlayer insulator 220. Next, the interlayer insulator 220 made of the silicon oxide film is etched by etching and contact holes are created respectively at the source domain 215 and the drain domain 216. Then, an aluminum film is formed in a thickness of 4000 angstrom by means of sputtering and is patterned to form electrodes 221 and 222 through the contact holes at the source domain 215 and 216.

Finally, a heat treatment is implemented at 300° C. in a hydrogen atmosphere. Through the above steps, the TFT having the LDD structure is fabricated. It is noted that the main purpose of this hydrogen plasma treatment is not to passivate the defects of the active layer 208 but to passivate the interface between the active layer 208 and the electrodes 213 and 214 made of aluminum.

For the n-channel type TFT fabricated in accordance to the fabrication steps of the present embodiment, the field effect mobility has increased only by about 10 to 20% after the implementation of the hydrogen plasma treatment as compared to the before the implementation thereof. This fact indicates that although a n-channel type TFT has not been practical unless it is treated by hydrogen plasma in the past, the defects at the grain boundary of the active layer 208 have been effectively passivated by only implementing the thermal oxidation step in which $NF_3$ is added.

[Third Embodiment]

Figure 5A:
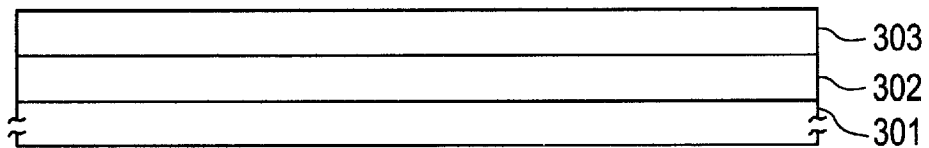
FIGS. 5A through 5H show steps for fabricating a TFT according to a third embodiment.

In the present embodiment, a case of fabricating a CMOS type TFT in which a n-channel type TFT and a p-channel type TFT are combined in a complementary manner will be shown. FIG. 5 is a diagram for explaining steps for fabricating the TFT according to the present embodiment. As shown in FIG. 5A, a silicon oxide film is formed as an underlying film 302 on a glass substrate 301 (Corning 1737) in a thickness of 2000 angstrom. Next, a substantially intrinsic amorphous silicon film is formed by the plasma CVD or reduced pressure CVD in a thickness of 700 angstrom. Then, a crystal silicon film 303 is formed by crystallizing the amorphous silicon film by the method shown in the first and second embodiments or by adequate crystallization methods such as heat treatment or irradiation by laser.

Figure 5B:
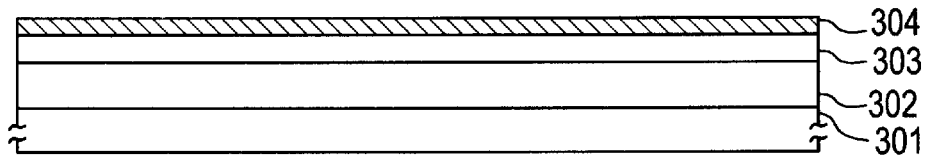
Figure 5C:
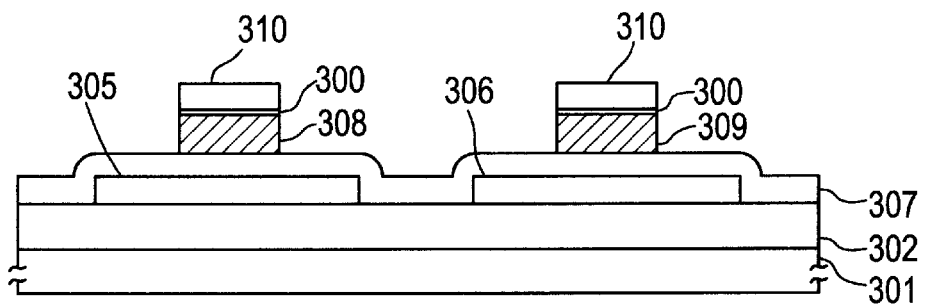
Figure 5D:
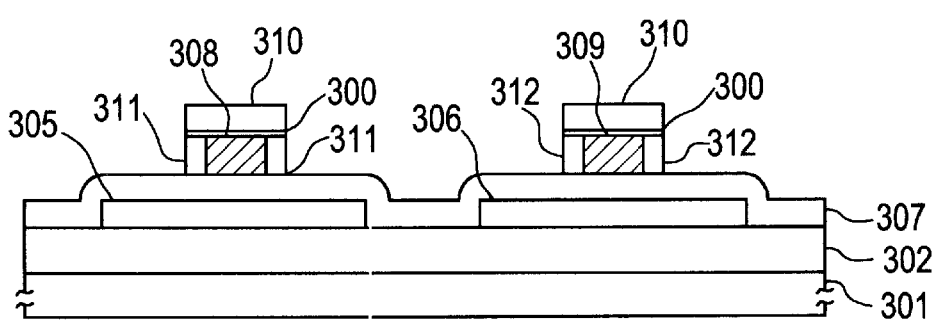

A thermal oxide film 304 is formed in a thickness of 200 angstrom as shown in FIG. 5B by implementing thermal oxidation for 2 hours within an oxygen atmosphere containing 400 ppm of $NF_3$ at 600° C. to passivate the defects at the grain boundary of the crystal silicon film 303 by Si. As a result, the crystal silicon film 303 turns out to be a suitable semiconductor material for the TFT and the like.

Next, after eliminating the thermal oxide film 106 by using an etchant such as buffer hydrofluoric acid, the crystal silicon film 303 is patterned into a shape of island to form active layers 305 and 306, respectively. Further, a silicon oxide film 307 which composes a gate insulating film is deposited in a thickness of 1500 angstrom by means of plasma CVD. It is noted that the active layer 305 comprises the n-channel type TFT and the active layer 306 comprises the p-channel type TFT.

Then, an aluminum film which comprises gate electrodes 308 and 309 is formed in a thickness of 4000 angstrom by sputtering. 0.2% of scandium is contained in the aluminum film in advance to suppress hillocks or whiskers from being produced. Then, the aluminum film is anodized within the electrolyte to form a dense anodic oxide of about 100 angstrom on the surface thereof. Then, a photoresist mask 310 is formed on the surface of the anodic oxide film to pattern the aluminum film and to form the gate electrodes 308 and 309, respectively.

Further, while attaching the photoresist mask 310, the gate electrodes 308 and 309 are anodized again to form anodic oxides 311 and 312. As the electrolyte, acidic solution containing 3 to 20% of citric acid, oxalic acid, chromic acid or sulfuric acid may be used. Aqueous solution containing 4% of oxalic acid is used in the present embodiment. In the state in which the photoresist mask 310 and the anodic oxide film 300 exist on the surface of the gate electrodes 905 and 906, porous anodic oxides 311 and 312 are formed only on the sides of the gate electrodes 308 and 309. The range of growth of the porous anodic oxides 311 and 312 may be controlled by adjusting the treatment time of the anodization. This range of growth determines the length of the low concentrate impurity domain (LDD domain). In the present embodiment, the porous anodic oxides 311 and 312 are grown in a length of 7000 angstrom.

Figure 5E:
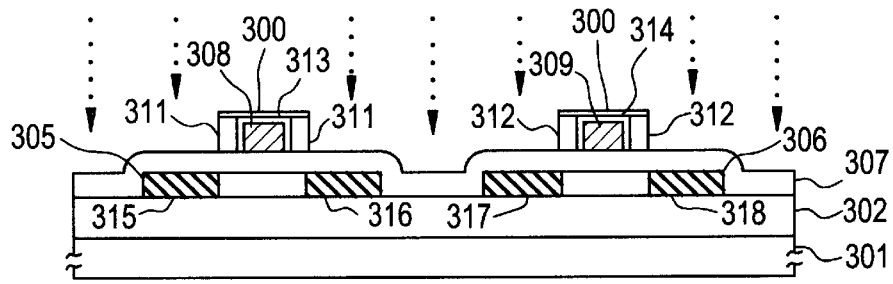

Next, after removing the photoresist mask 310, the gate electrodes 308 and 309 are anodized again to form dense and rigid anodic oxide films 313 and 314 as shown in FIG. 5E. In the present embodiment, ethylene glycol solution containing 3% of tartaric acid is neutralized by aqueous ammonia to pH 6.9 to use as its electrolyte.

Next, phosphorus ions are injected to the island active layers 305 and 306 by means of ion doping by using the gate electrodes 308 and 309 as well as the porous anodic oxides 311 and 312 as a mask. As doping gas, phosphine which has been diluted by hydrogen to 1 to 10% is used. The doping is implemented with acceleration voltage of 60 to 90 kV and the dosage of $1 \times 10^{14}$ to $8 \times 10^{15}$ atoms/cm$^2$. In the present embodiment, the acceleration voltage is set at 80 kV and the dosage is set at $1 \times 10^{15}$ atoms/cm$^2$.

At this time, although phosphorus ions do not transmit through the gate electrodes 308 and 309 as well as the porous anodic oxides 311 and 312, they transmit through the gate insulating film 307 and are injected to island silicon 305 and 306. As a result, n-type impurity domains 315 through 318 are formed respectively as shown in FIG. 5E.

Figure 5F:
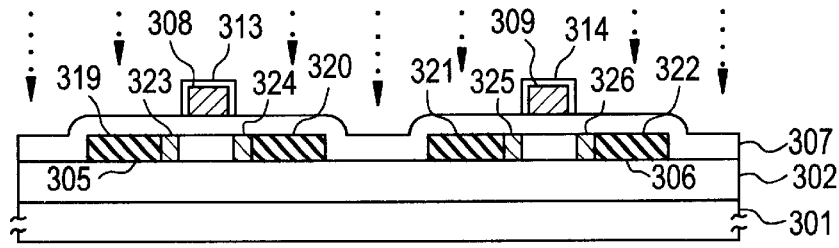

After eliminating the dense anodic oxide film 300 by buffer hydrofluoric acid as shown in FIG. 5F, the porous anodic oxides 311 and 312 are eliminated by a mixed acid in which phosphoric acid, acetic acid and nitric acid are mixed. Because the porous anodic oxides 311 and 312 may be readily eliminated, the dense and rigid anodic oxides 313 and 314 will not be etched.

Next, P phosphorus ions are doped again. The doping is implemented with acceleration voltage of 60 to 90 kV and the dosage of $1\times10^{12}$ to $1\times10^{14}$ atoms/cm². The acceleration voltage is set at 80 kV and the dosage at $1\times10^{14}$ atoms/cm² in the present embodiment. At this time, although P phosphorus ions do not transmit through the gate electrodes 308 and 309, they transmit through the gate insulating film 307 and are injected to the active layers 305 and 306. Accordingly, the domains into which phosphorus ions have been injected twice turn out to be n-type high concentrate impurity domains 319 through 322 and the domains into which phosphorus ions have been injected once turn out to be n-type low concentrate impurity domains 323 through 326.

Figure 5G:
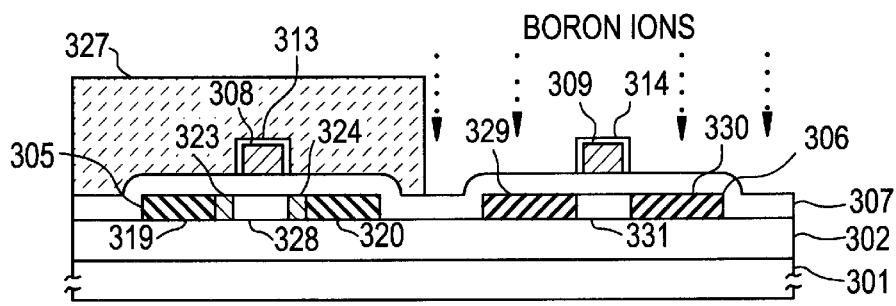

Then, as shown in FIG. 5G, after covering the domain which turns out to be the n-channel TFT by polyimide or heat resistant resist 327, boron ions are doped in order to invert the conductive type of the active layer 306 from n-type to p-type. Diborane which has been diluted to about 1 to 10% by hydrogen is used as the doping gas and the acceleration voltage is set at 80 kV and the dosage of boron is set at $2\times10^{15}$ atoms/cm². Because no boron is injected to the domain covered by the polyimide 602, it remains n-type. Accordingly, the high concentrate impurity domains 319 and 320 correspond to the source and drain domains of the n-channel type TFT, respectively, in the active layer 305 and because no phosphorus nor boron ion is injected to the domain 328 right below the gate electrode 308, it remains intrinsic and corresponds to the channel of the TFT.

Because a large amount of boron is injected in the doping of boron ions, no low concentrate impurity domain (LDD domain) is formed and only the p-type high concentrate impurity domains 329 and 330 are formed. The high concentrate impurity domains 329 and 330 correspond to the source and drain domains of the p-channel type TFT, respectively. Further, because no phosphorus and boron ion is injected to the domain 331 right below the gate electrode 309, it remains intrinsic and corresponds to the channel.

Figure 5H:
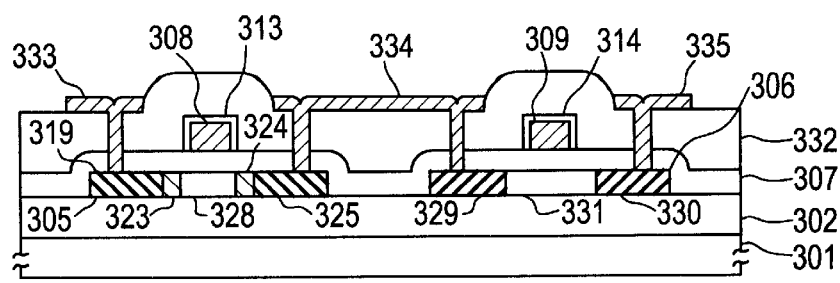

Next, the resist 327 is removed and a silicon oxide film of 1 µm thick is formed as an interlayer insulating film 332 by means of plasma CVD as shown in FIG. 5H. Contact holes are formed therethrough. Source and drain electrodes as well as wires 333 through 335 are formed by metallic materials such as multi-layered film of titanium and aluminum to the contact holes. Finally, a heat treatment is implemented for 2 hours within a hydrogen atmosphere at 350° C. The CMOS thin film transistor is completed going through such steps.

Because the CMOS structure in which the n-type TFT and the p-type TFT are combined complementarily is formed in the present embodiment, electric power may be lowered in driving such TFT. Further, because it is arranged so as to dispose the low concentrate impurity domain 312 between the channel 328 and the drain domain 320 of the n-channel type TFT, it allows to prevent a high electric field from being generated between the channel 328 and the drain 320.

It is noted that the conditions of the thermal oxidation step in which $NF_3$ is added is not confined to what have been described in the above-mentioned first through third embodiments. The concentration of $NF_3$ within the oxygen atmosphere and the like may be determined such that the thermal oxide film grows in a thickness of several hundreds angstrom by heating for several hours at temperatures below the distortion point of the glass substrate so that the distortion or deformation of the substrate, on which the TFT is formed, caused in the thermal oxidation step falls within the permissible range.

Further, because the Corning 1737 glass whose distortion point is 667° C. has been used as the glass substrate in the first through third embodiments, the heating temperature in the thermal oxidation step has been set at 600° C. However, if a Corning 1737 glass whose distortion point is 593° C. is used for example, the heating temperature in the thermal oxidation step may be preferably around 500 to 550° C. because the distortion point is 593° C.

In the method for fabricating a semiconductor device according to the present invention, the thermal oxide film may be grown up to several hundreds angstrom of thickness by heating for several hours to ten-odd hours at a temperature below the distortion point of the glass substrate by arranging so as to grow the thermal oxide film within an oxidizing atmosphere containing fluorine compound. Further, because extra Si is generated by growing the thermal oxide film and the defects at the grain boundary of the crystal silicon film may be passivated by Si, the hydrogen plasma treatment may be eliminated.

Further, because the surface of the crystal silicon film may be flattened by the thermal oxidation step and because the gate insulating film composed of a deposited film may be formed with a favorable coating quality even if the step of obtaining the crystal silicon film through the irradiation of laser light is adopted, the interfacial level between the gate insulating film and the active layer may be lowered. Because the crystallinity of the crystal silicon film excels even if laser light is irradiated, the mobility of the semiconductor device may be improved.

Accordingly, an insulated gate type semiconductor device such as a TFT having high mobility and high reliability may be fabricated on a substrate, such as a glass substrate, on which it is difficult to implement a treatment at high temperatures of about 1000° C.

What is claimed is:

1. A method for fabricating a semiconductor device having at least one thin film transistor, comprising steps of:

forming an amorphous semiconductor film comprising silicon;

crystallizing said amorphous semiconductor film to form a crystalline semiconductor film comprising silicon wherein a laser is used to crystallize or further crystallize said semiconductor film;

forming a thermal oxide film on the surface of said crystalline semiconductor film by heating in an oxidizing atmosphere to which fluorine compound gas is added;

removing said thermal oxide film on the surface of said crystalline semiconductor film;

forming an active layer of said thin film transistor by etching said crystalline semiconductor film after said removing step; and depositing an insulating film on the surface of said active layer.

2. A method for fabricating a semiconductor device having at least one thin film transistor, comprising steps of:

forming an amorphous semiconductor film comprising silicon;

crystallizing said amorphous semiconductor film by irradiating laser light to form a crystalline semiconductor film comprising silicon;

forming a thermal oxide film on the surface of said crystalline semiconductor film by heating in an oxidizing atmosphere to which fluorine compound gas is added;

eliminating said thermal oxide film on the surface of said crystalline semiconductor film;

forming an active layer of said in film transistor by etching said crystalline semiconductor film after said eliminating step; and depositing an insulating film on the surface of said crystalline semiconductor film.

3. A method for fabricating a semiconductor device in fabricating a thin film transistor on a substrate having an insulated surface, comprising steps of:

forming an amorphous semiconductor film comprising silicon;

crystallizing said amorphous silicon film to form a crystalline semiconductor film comprising silicon wherein a laser is used to crystallize or further crystallize said semiconductor film;

forming a thermal oxide film on the surface of said crystalline semiconductor film by heating in an oxidizing atmosphere to which fluorine compound gas is added;

eliminating said thermal oxide film on the surface of said crystalline semiconductor film;

forming an active layer of said thin film transistor by shaping said crystalline semiconductor film after said eliminating step;

depositing an insulating film on the surface of said active layer to form a gate insulating film at least on the surface of a channel domain;

forming a gate electrode on the surface of said gate insulating film; and forming a source and a drain in a manner of self-adjustment by injecting impurity ions which give a conductive type to said active layer by using said gate electrode as a mask.

4. A method for fabricating a semiconductor device in fabricating a thin film transistor on a substrate having an insulated surface, comprising steps of:

forming an amorphous semiconductor film comprising silicon;

crystallizing said amorphous semiconductor film to form a crystalline semiconductor film comprising silicon;

irradiating laser light to said crystalline semiconductor film;

forming a thermal oxide film on the surface of said crystalline semiconductor film by heating in an oxidizing atmosphere to which fluorine compound gas is added;

eliminating said thermal oxide film on the surface of said crystalline semiconductor film;

forming an active layer of said in film transistor by shaping said crystalline semiconductor film after said eliminating step;

depositing an insulating film on the surface of said active layer to form a gate insulating film at least on the surface of a channel domain;

forming a gate electrode on the surface of said gate insulating film; and forming a source and a drain in a manner of self-adjustment by injecting impurity ions which give a conductive type to said active layer by using said gate electrode as a mask.

5. The method for fabricating the semiconductor device according to any one of claims 1 through 4, wherein comprising a step of adding a metal element into said amorphous semiconductor film in concentration of $1 \times 10^{16}$ to $5 \times 10^{19}$ atom/cm$^3$ after the forming of said amorphous semiconductor film.

6. The method for fabricating the semiconductor device according to claim 5, wherein said metal element is at least an element of one or more types selected from the group consisting of Fe, Co, Ni, Ru, Rh, Pd, Os, Ir, Pt, Cu and Au.

7. The method according to any of claims 1 through 4 wherein defects of the crystalline semiconductor film is passivated with silicon atoms in the step of forming the thermal oxide film.

8. The method of claim 1 wherein said thermal oxide film has a thickness of 200–500 Å.

9. The method of claim 2 wherein said thermal oxide film has a thickness of 200–500 Å.

10. The method of claim 3 wherein said thermal oxide film has a thickness of 200–500 Å.

11. The method of claim 4 wherein said thermal oxide film has a thickness of 200–500 Å.

12. A method for fabricating a semiconductor device having at least one thin film transistor, comprising steps of:

forming a semiconductor film on an insulating surface;

increasing crystallinity of the semiconductor film by laser irradiation, wherein ridges are formed on a surface of the crystalline semiconductor film;

reducing said ridges on the surface of the crystalline semiconductor film by thermal oxidation with fluorine present for forming a thermal oxide film;

removing said thermal oxide film; and then forming all active layer of said thin film transistor by patterning said crystalline semiconductor film.

13. The method according to claim 12 wherein said semiconductor film formed on the insulating film has a thickness of 1000 Å or less.

14. The method of claim 12 wherein said thermal oxide film has a thickness of 200–500 Å.

15. A method for fabricating a semiconductor device having at least one thin film transistor, comprising steps of:

forming an amorphous semiconductor film comprising silicon on an insulating surface;

crystallizing the semiconductor film by heat treatment, increasing crystallinity of the semiconductor film by laser irradiation, wherein ridges are formed on a surface of the crystalline semiconductor film;

reducing said ridges on the surface of the crystalline semiconductor film by thermal oxidation for forming a thermal oxide film in an oxidizing atmosphere to which fluorine compound gas is added;

removing said thermal oxide film; and then forming an active layer of a thin film transistor by patterning said crystalline semiconductor film.

16. The method according to claim 15 wherein said semiconductor film formed on the insulating film has a thickness of 1000 Å or less.

17. The method of claim 15 wherein said thermal oxide film has a thickness of 200–500 Å.

18. A method for fabricating a semiconductor device having at least one thin film transistor, comprising steps of:

forming a semiconductor film on an insulating surface;

irradiating the semiconductor film with a laser light, wherein ridges are formed on a surface of the crystalline semiconductor film;

forming a thermal oxide film on the irradiated film in the presence of fluorine in order to make the ridges on the surface of the irradiated semiconductor film rounded;

removing the thermal oxide film to expose the flattened semiconductor film;

forming an active layer of said thin film transistor by etching said semiconductor film after said ridges reducing step; and then forming an insulating film on an active layer by plasma CVD.

19. The method according to claim 18 wherein said semiconductor film formed on the insulating film has a thickness of 1000 Å or less.

20. The method of claim 18 wherein said thermal oxide film has a thickness of 200–500 Å.

21. A method for fabricating a semiconductor device having at least one thin film transistor, comprising steps of:

forming an amorphous semiconductor film comprising silicon on an insulating surface;

crystallizing or further crystallizing said semiconductor film using a laser, whereby ridges are formed on said crystallized semiconductor film;

forming a thermal oxide film on said crystallized semiconductor film to reduce said ridges on the surface of the crystallized semiconductor film in an oxidizing atmosphere to which fluorine compound gas is added; and removing said thermal oxide film.

22. The method according to claim 21 wherein said ridges have a height of 100–300 Å.

23. The method according to claim 21 wherein said thermal oxide film has a thickness of 200–500 Å.

24. A method for fabricating a semiconductor device having at least one thin film transistor, comprising steps of:

forming an amorphous semiconductor film comprising silicon on an insulating surface;

crystallizing said semiconductor film by heat treatment;

irradiating a laser light to said crystallized semiconductor film, whereby ridges are formed on said crystallized semiconductor film;

forming a thermal oxide film on said crystallized semiconductor film to reduce said ridges on the surface of the crystallized semiconductor film in an oxidizing atmosphere to which fluorine compound gas is added; and removing said thermal oxide film.

25. The method according to claim 24 wherein said ridges have a height of 100–300 Å.

26. The method according to claim 24 wherein said thermal oxide film has a thickness of 200–500 Å.

* * * * *